United States Patent
Leijten-Nowak

(10) Patent No.: US 7,251,672 B2
(45) Date of Patent: Jul. 31, 2007

(54) RECONFIGURABLE LOGIC DEVICE

(75) Inventor: Katarzyna Leijten-Nowak, Hulsel (NL)

(73) Assignee: NXP B.V., Eindhoven (NL)

( * ) Notice: Subject to any disclaimer, the term of this patent is extended or adjusted under 35 U.S.C. 154(b) by 751 days.

(21) Appl. No.: 10/477,861

(22) PCT Filed: May 15, 2002

(86) PCT No.: PCT/IB02/01681

§ 371 (c)(1),
(2), (4) Date: Nov. 13, 2003

(87) PCT Pub. No.: WO02/093745

PCT Pub. Date: Nov. 21, 2002

(65) Prior Publication Data
US 2004/0145942 A1 Jul. 29, 2004

(30) Foreign Application Priority Data
May 16, 2001 (EP) .................................. 01201833

(51) Int. Cl.
G06F 7/38 (2006.01)

(52) U.S. Cl. ..................................................... 708/235
(58) Field of Classification Search ................. 708/235
See application file for complete search history.

(56) References Cited

U.S. PATENT DOCUMENTS

| 5,724,276 | A | * | 3/1998 | Rose et al. | .................. 708/235 |
| 5,761,099 | A | * | 6/1998 | Pedersen | ..................... 708/230 |
| RE35,977 | E | * | 12/1998 | Cliff et al. | ................... 708/235 |
| 6,288,570 | B1 | * | 9/2001 | New | ........................... 326/41 |
| 6,708,191 | B2 | * | 3/2004 | Chapman et al. | ........... 708/235 |

* cited by examiner

Primary Examiner—David H. Malzahn

(57) ABSTRACT

A reconfigurable logic device according to the invention comprises a lookup table (LUT) (11.1) with an input (in 1) for receiving an input signal and an output (out) for providing a binary output signal. The reconfigurable logic device is characterized by, a control input (ctrl) for receiving a control bit, a controllable inverting gate (11.2) for providing the address signal to the LUT (11.1) in response to the control bit and the input signal, and by a controllable inverting gate (11.3) for providing a modified output signal in response to the output signal of the LUT and the control bit. The reconfigurable logic device according to the invention can operate at a high speed, and at the same time have a relatively modest configuration memory.

8 Claims, 17 Drawing Sheets

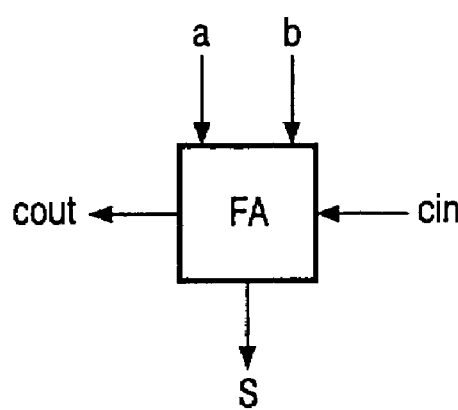 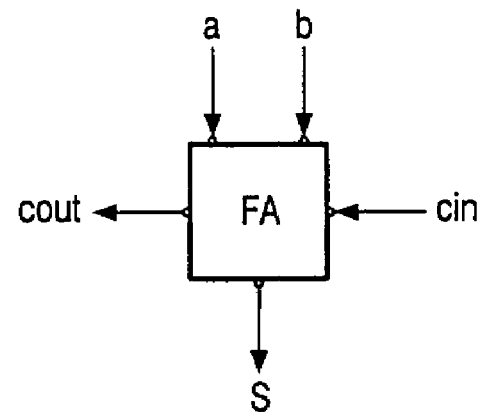
FIG. 9A    FIG. 9B
| cin | a | b | cout | S |
|-----|---|---|------|---|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |
— symmetry axis
FIG. 10

RECONFIGURABLE LOGIC DEVICE

The invention relates to a reconfigurable logic device comprising a logic element with a lookup table (LUT), an input for receiving an address signal and an output for providing an output signal.

In (re)configurable logic devices (e.g. Field Programmable Gate Arrays (FPGAs)) both the functionality of the basic logic elements (logic cells) as well as the interconnect structure between them are programmable. Programmability is obtained by the use of programmable switches, the state of which is kept in a configuration memory. Programmable switches control routing resources by determining a connection between wire tracks or its absence. They also define the functionality of logic elements by controlling internal multiplexers (a valid signal selection). Next to that, part of the configuration memory cells are used as data memory elements for look-up tables and user memories.

The use of look-up tables (LUTs) is the most common way to implement logic functions in configurable logic devices. Such an approach is used in most of the commercial FPGA devices, for example Xilinx (e.g. XC4000, XC5000, Virtex-I, Virtex-II families), Altera (e.g. FLEX family), Atmel (AT40K family), Actel. The wide use of look-up tables comes from their flexibility: a k-input look-up table can implement any logic function of k-variables. Such a LUT requires $2^k$ memory cells, which store the logic function output for all possible combinations of input bits (like in a truth table). Since the contents of memory cells in a LUT can be changed, the stored truth values, and thus a generated logic function, can be easily replaced by another one. Because of the programmable nature of configurable logic devices a high flexibility is revealed to the user. A user may use such devices, for example, for rapid prototyping, for late upgrades/specializations in a system or to boost system performance, in comparison to software programmable solutions.

Cost-efficiency (in terms of area, performance, power and code size) is one of the most important issues in the design of configurable logic devices, especially those which are used in an embedded context (System-on-Chip). Although very flexible, configurable devices show a number of disadvantages, especially in comparison with ASICs. They are bigger (due to a large configuration memory and a huge amount of interconnect resources), slower (due to considerable delays of interconnect and logic) and consume more power (due to a large load on programmable tracks). In dynamically reconfigurable logic devices, in which the configuration context can be changed at run-time, an additional measure of efficiency is reconfiguration time. This time should be short since the execution of the next phase of an algorithm directly depends on it. However, due to a large configuration memory which has to be reloaded this is often not the case. Most of the mentioned cost figures are directly or indirectly influenced by the size of the configuration memory. Because of this fact, minimization of the configuration memory size is one of the major concerns in the design of (re)configurable logic devices.

This issue may be crucial in (but not limited to) situations where:

A configurable logic device has look-up table based logic elements; since every device consists of many logic elements and the LUT size grows exponentially with the number of inputs, very many memory bits are required just to support the functionality.

A configurable logic core is embedded with other IP blocks on the same chip. In this case, available silicon area and power consumption which are determined by the chip package type and often also by a limited battery life-time for portable devices, may be limiting factors.

A configurable logic core works with a number of configuration contexts (a dynamically reconfigurable logic core). In this case, the size of the required configuration memory is roughly n times bigger than the memory size in case of a single-context device; here n is the number of configuration contexts.

An additional problem in configurable logic devices is the desire to simultaneously support implementation of random logic and arithmetic functions, and often to implement small memories as well. Generally, random logic benefits from a coarser granularity (bigger LUTs) to minimize logic depth. On the other hand, in arithmetic circuits the LUT size is preferably smaller due to dependence of the most significant bits of a result on less significant bits of that result.

Thus, the requirement to limit the size of the configuration memory and at the same time to guarantee enough flexibility to support various functions are in opposition, especially for LUT-based devices. Finding a right balance thus remains a challenge.

LUT-based configurable logic devices represent a dominant group within the state-of-the-art reconfigurable architectures. In the following mainly the aspects associated with the architecture and implementation of a logic element are considered as these strongly determine the cost-efficiency of configurable logic devices. The description is concentrated primarily on applicability of different logic elements for arithmetic functions, giving representative examples; As discussed before, the use of LUT-based logic elements for implementation of random functions is rather straightforward.

It is a purpose of the invention to provide a reconfigurable logic device as described in the opening paragraph, in which arithmetic operations can be implemented with a relatively small number of configuration bits, and which yet has a relatively high speed.

According to the invention the reconfigurable logic device comprising a logic element with a lookup table (LUT), an input for receiving an addres signal and an output for providing an output signal, therefor is characterized by a control input (ctrl) for receiving a control signal, a controllable inverting gate (11.2) for providing an address signal to the LUT (11.1) in response to the control signal (ctrl) and the input signal (in1), a controllable inverting gate (11.3) for providing a modified output signal (out') in response to the output signal of the LUT (11.3) and the control signal.

A controllable inverting gate is defined herein as a gate which either transmits the input signal unaltered if the control signal has a first logical value, or transmits the input signal in inverted form if the control signal has a second logica value. In the sequel a controllable inverting gate will for simplicity be shown in the form of an EXOR-gate having one input for receiving the control signal and a second input for receiving the signal which is to be controllably inverted. However other implementations are possible, for example a multiplexer having a selection input for receiving the control signal, a first input for receiving the unaltered signal and a second input for receiving the inverted signal.

Apart from the input for receiving an address signal the reconfigurable logic device may have more of such inputs for receiving address signals. The additional inputs may be coupled directly to the LUT. Alternatively one or more or each of the additional inputs may be coupled to the LUT via a controllable inverting gate which provides a modified address signal to the LUT in response to the control signal and the address signal receieved at said additional input. Likewise, the LUT may have more than one output. Additional outputs may also be coupled to a controllable inverting gate for providing a modified output signal in response to the output signal at said output of the LUT and the control signal.

The measure according to the invention is based on the exploitation of the inverting property of an adder for efficiently implementing the LUT of the configurable device. By exploiting this inverting property the reconfigurable logic device can be implemented with a smaller number of configuration bits. The additional logic functions required to implement the controllable inverting gates, can be realized with only a small number of gates. The additional delay introduced by the controllable inverters therefore is relatively small, so that the reconfigurable device still can have a relatively high speed. Also the power consumption is reduced, as the reconfigurable logic device can have a relatively modest number of interconnections.

An embodiment of the reconfigurable logic device according to the invention, is characterized by a multiplexer which is controlled by a selection signal so as to select from at least a first and a second modified output signal as the output signal of the logic element. This application of a multiplexer in the logic element allows implementation of wider logic functions. According to the Shannon expansion theory, any n+1-input logic function can be described as:

$$F = \overline{S} \circ F1 + S \circ \overline{F1}$$

S is an additional input signal for example of a logic element (a mux control signal) and F1 and $\overline{F1}$ are functions of n inputs implemented in LUTs.

These and other aspects are aspects are described in more detail with reference to the drawing. Therein:

FIG. 1 shows an example of a logic block of a reconfigurable device of the Xilinx Virtex-I family, FIG. 2 shows an implementation of an adder in the logic block of FIG. 1, FIG. 3 shows an example of a logic block of an Atmel device, FIG. 4 shows an implementation of an adder in the logic block of FIG. 3, FIG. 5 shows a Low-Power PGA logic element, FIG. 6 shows an implementation of an adder with the logic element of FIG. 5, FIG. 7 shows a further logic element known from the prior art, FIG. 8 shows an implementation of an adder with the logic element of FIG. 7, FIG. 9 illustrates the inverting property of an adder, FIG. 10 further illustrates this property in the form of a table, FIG. 11 shows a first embodiment of a logic element according to the invention, FIG. 12 shows a second embodiment of a logic element according to the invention, FIG. 13 shows an implementation of an adder in the second embodiment, FIG. 14 shows an implementation of an adder in the first embodiment, FIG. 15A schematically shows a multi output LUT, FIG. 15B shows a first implementation of the multi-output LUT of FIG. 15A, FIG. 15C shows a second implementation of the multi-output LUT of FIG. 15A, and FIG. 15D shows a third implementation of the multi-output LUT of FIG. 15A, FIG. 16 shows a multiplier array for multiplying two numbers, FIG. 17 shows an element of FIG. 16 in more detail, FIG. 18 shows an implementation of two of those elements in a reconfigurable logic device according to the invention, FIG. 19 shows a portion of FIG. 18 in more detail.

Figure 1:
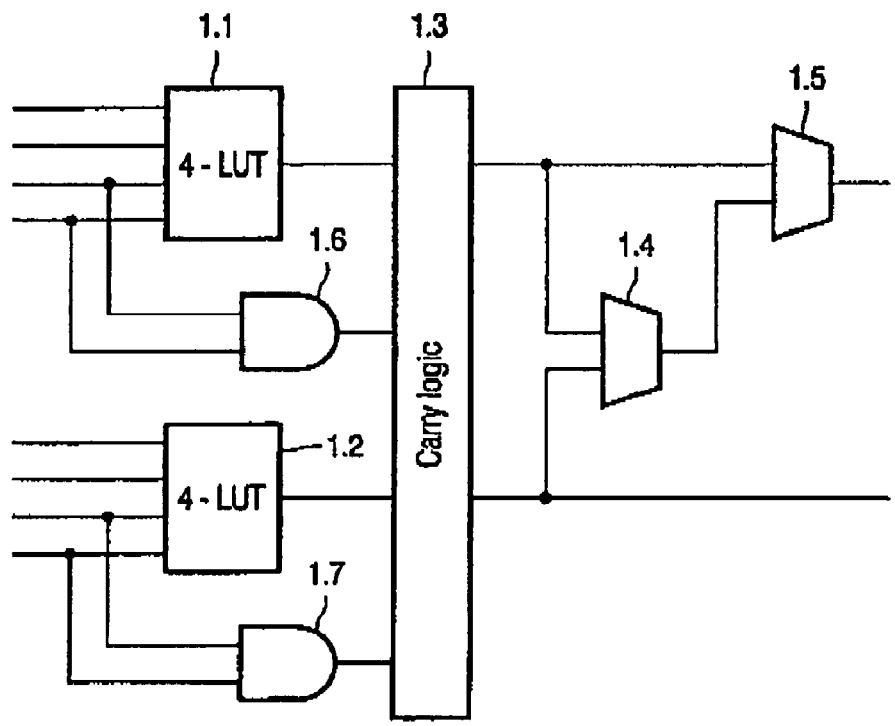

FIG. 1 shows one of the two logic slices of a logic element of the Xilinx Virtex-I family; the other slice is identical therewith. A single slice contains two 4-bit look-up tables (4-LUT) 1.1, 1.2 with two independent sets of inputs. Hence, two independent functions of four variables may be implemented in a slice. The outputs of both LUTs are coupled via carry logic circuit 1.3 to a first and a second 2:1 multiplexer 1.4 and 1.5. The carry logic circuit 1.3 receives further input signals from a first and a second AND-gate 1.6, 1.7, which each receive two input signals from a respective set of inputs. Application of a multiplexer for selecting outputs of several look-up tables is a common approach for implementing wider logic functions. In this way a mapped random logic function can be extended with an additional logic variable.

Figure 2:
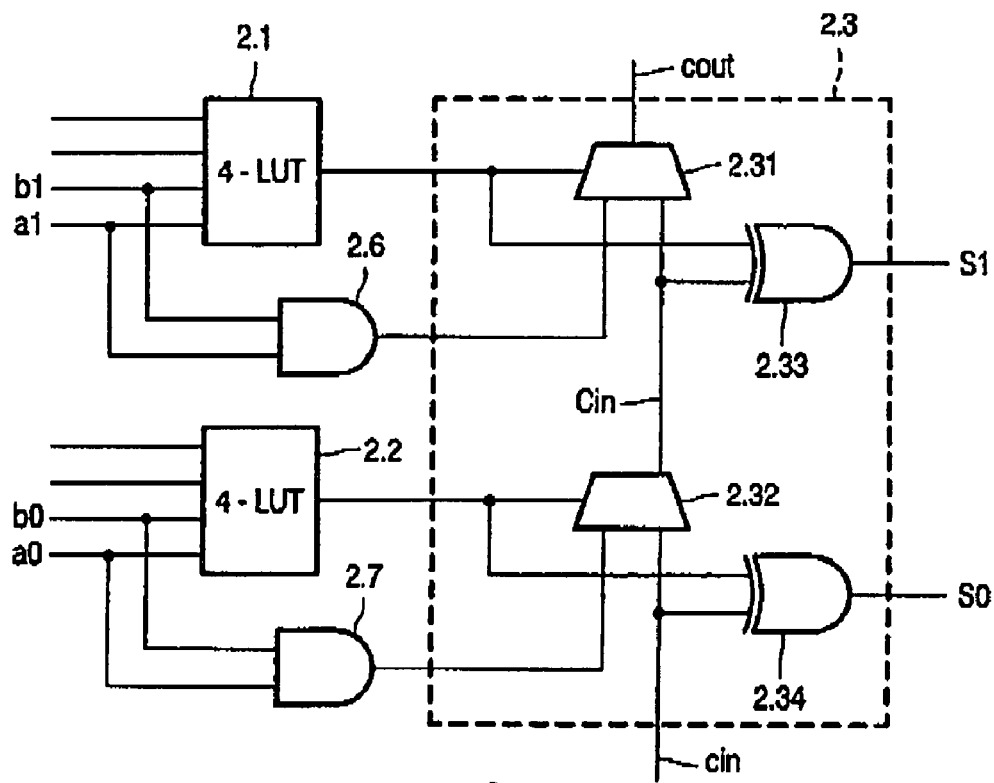

With respect to arithmetic functions, every logic slice may implement, for example, a 2-bit adder as is shown in FIG. 2. Every LUT 2.1, 2.2 generates a partial sum of two bits. The output of a LUT 2.1, 2.2 together with an appropriate carry input signal cin', cin comprise inputs of an XOR gate 2.33, 2.34, which generates the sum value (1-bit per LUT). The carry output signal cout is generated in a dedicated circuitry 2.3. A 2-bit adder implemented in such a way is serial in the sense that the generation of the sum bits is dependent on the propagated carry signal.

The circuit shown in FIG. 1 has the advantage of a high flexibility in implementing random logic functions due to two independent sets of inputs. However, since only two LUT inputs are used in arithmetic mode (FIG. 2), the utilization of the LUTs is inefficient. Another disadvantage is that two separate decoders are required for every LUT; if a LUT is used also as a distributed memory block, in total two decoders per LUT are required (separate for writing and reading operation). As another disadvantage it is mentioned that due to separate LUT input sets, and thus separate input pins, very many routing tracks are required (at least 2×4 routing tracks per logic slice). This entails an increased number of switches and a greater size of configuration memory. It also causes a higher power consumtion.

Figure 3:
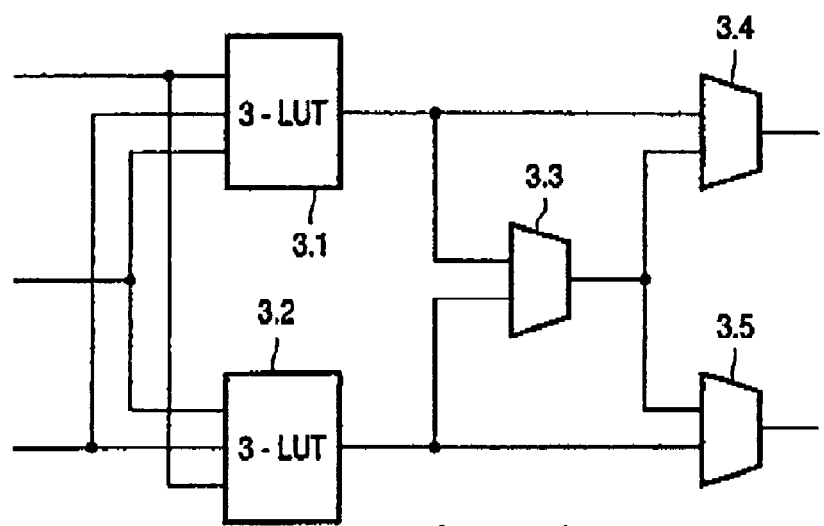
Figure 4:
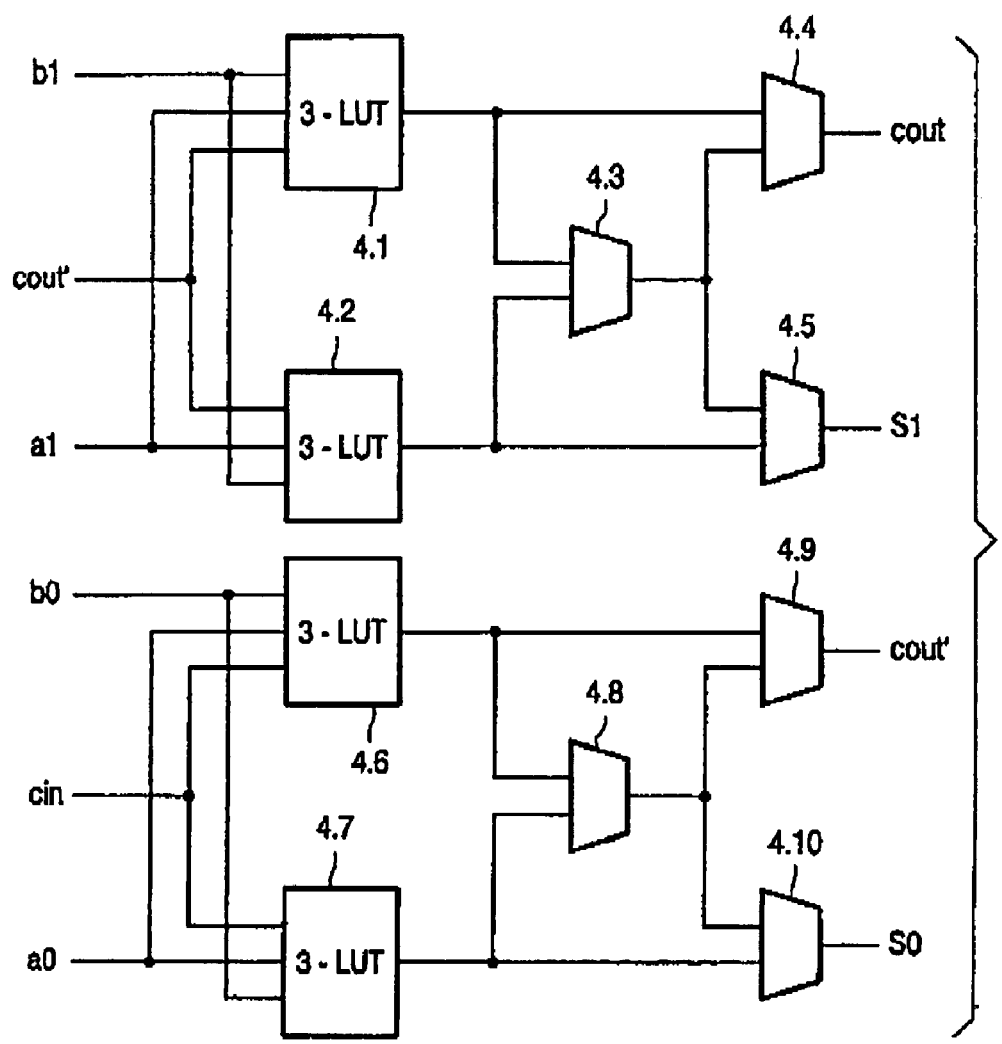

In many arithmetic operations several output bits are generated from the same set of input bits. Exploition of this characteristic in the LUT-based arithmetic function generation would mean that the inputs of some LUTs could be shared. Although this potentially limits flexibility in terms of a number of random logic functions which may be implemented, it leads, at the same time, to a considerable reduction of routing resources since only a single set of inputs has to be supported. This is an important optimization for datapath-or DSP-oriented configurable logic devices. Such an approach has been used, for example, in Atmel AT40K devices, illustrated in FIG. 3. The logic element shown therein has two LUTs 3.1, 3.2 with shared inputs. Two outputs signals are selectable by multiplexers 3.3, 3.4 and 3.5. The corresponding implementation of a two-bit adder is shown in FIG. 4. It has a first and a second logical unit. The first logical unit 4.6, 4.7, 4.8, 4.9, 4.10 calculates the first output bit So, and the intermediate carry out bit cout' from the input bits a0, b0 and the carry in bit cin. The second logical unit 4.1, 4.2, 4.3, 4.4, 4.5 10 calculates the second output bit S1, and the carry out bit cout from the input bits a1, b1 and the intermediate carry out bit cout'.

Figure 5:
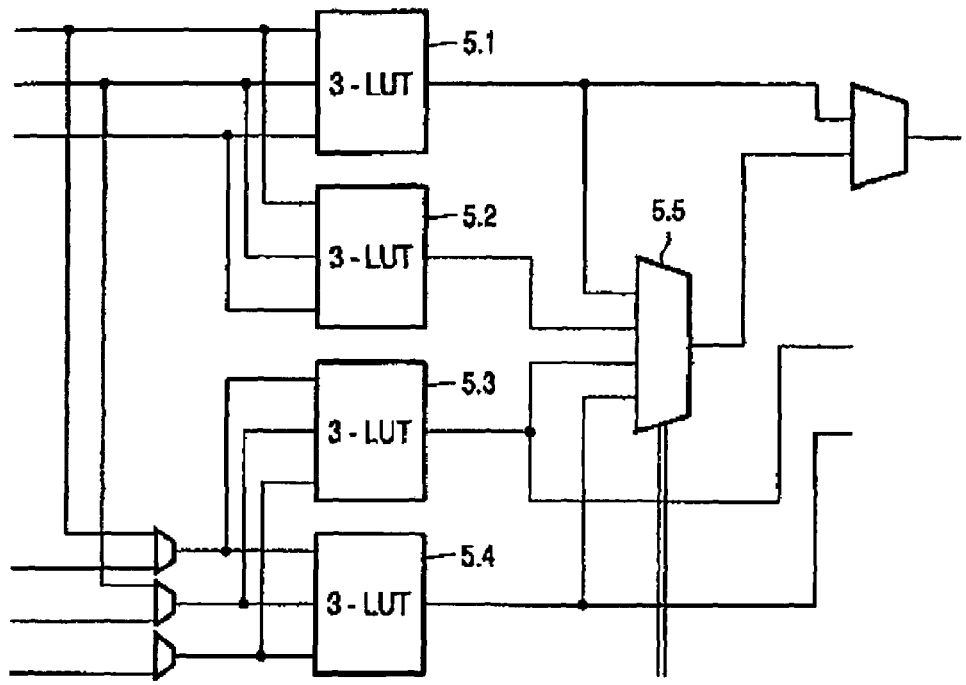
Figure 6:
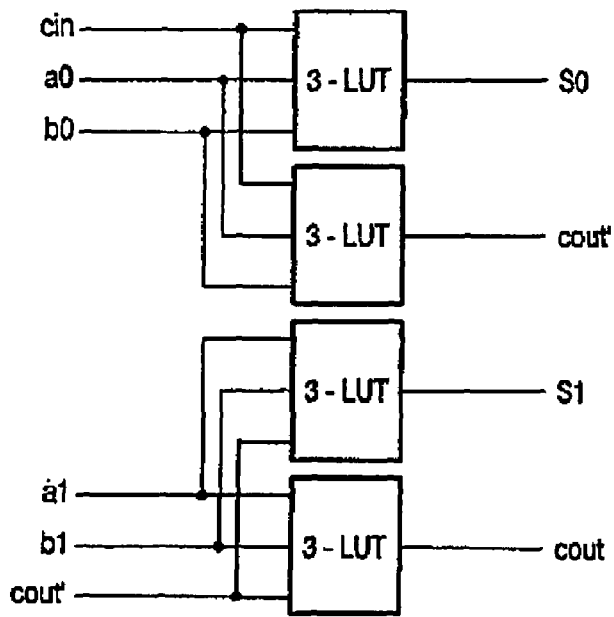

The same approach is shown in FIG. 5 for a logic element of Low-Power PGA. FIG. 6 shows the implementation of an adder with such a logic element. Conceptually, logic elements of both devices are similar but they differ in granularity: A logic element in the Atmel AT40K has two LUTs 3.1, 3.2 while a logic element of the LP-FPGA has four LUTs 5.1, 5.2, 5.3, 5.4. In contrast to the Virtex's logic element, both devices use 3-input LUTs. These LUTs, similarly to the Xilinx approach, can be connected in a multiplexer 5.5 to enable implementation of wider functions (here: of 4-inputs). The use of 3-LUTs improves the LUT utilization in the arithmetic mode (the complete LUT is used to store valid data). In both logic element architectures an addition operation is generated in a serial way: an output signal from one of the LUTs (here: cout') is an input for an another LUT. Furthermore, no dedicated circuitry is used for carry generation.

Advantages of this approach are that a single LUT is better utilized for arithmetic functions, i.e. no resources are waisted. Furthermore less routing resources and thus also a smaller configuration memory is required due to the applied input sharing technique. Disadvantages are however that a separate decoder is required for every LUT even if their inputs are shared (a LUT decoder is usually implemented as a multiplexer tree which selects only one LUT output).

Figure 7:
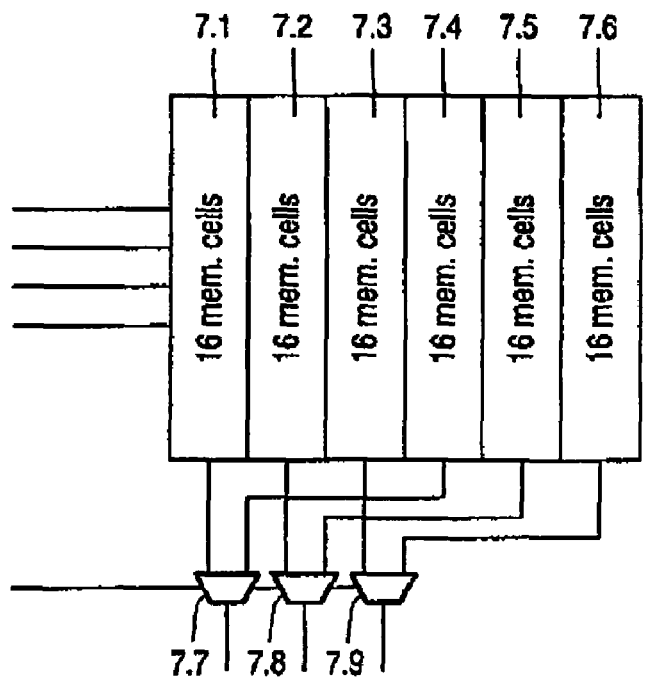

The same concept of sharing LUT inputs in a logic element has been applied in the Reconfigurable Computing Cache Architecture (RCCA). This approach is described in Kim H. -S., Somani A. K., Tyagi Ak., A Reconfigurable Multi-function Computing Cache Architecture, 8*th ACM Interationa*; *Symposium on FPGAs*, Monterey, February 2000. This architecture is schematically shown in FIG. 7. In contrast to the traditional LUT implementation, the RCCA uses, however, a LUT implemented in a memory-like way. This means that one address decoder is used to select a multi-bit output word, and not just a single bit. In the RCCA, random logic functions are implemented in the same way as in traditional LUT-based architectures. Each 16-cell memory column 7.1-7.6 of an RCCA logic element stores outputs of an arbitrary logic function. Since the set of inputs is shared between all memory columns, a multi-bit output, based on the same set of inputs, is generated.

Implementation of arithmetic functions in a RCCA looks a bit different. The problem of dependency of more significant bits on less significant bits via carry propagation is solved as in a carry-select adder. The RCCA multi-output LUT 8.1-8.6 stores a truth table of an arithmetic function for both carry signal equal to "0" and "1". Selection of the right outputs is done with multiplexers 8.7, 8.8, 8.9 using a carry input signal cin from the previous stage (RCCA block) (see FIG. 8). Although generation of arithmetic functions is in this way very fast, it is also very expensive since many memory cells are required to store truth table values for both values of the control signal (e.g. carry signal).

Advantages of this approach are that a single decoder can be complied with for a multi-output LUT. The device has a compact layout due to a memory-like implementation of a single LUT. It provides for a fast generation of arithmetic functions since several bits of a result are generated simultaneously using a selection mechanism. It is however an expensive solution since three times the number of memory bits of the standard solution, as illustrated in FIGS. 3 to 6 is required. For coarse functions (e.g bigger than 2-bit operands) this approach is cost-inefficient. A further disadvantage is that a considerable part of the multi-output LUT may be unused if mapped random logic functions cannot exploit the input sharing property.

FIG. 9 schematically illustrates the inverting property of an adder. FIG. 9A shows a full adder FA having inputs a, b, cin and outputs S, cout. FIG. 9B illustrated that this full adder is equivalent to a full adder of which all input signals as well as all output signals are inverted. Thus:

$$\overline{S}(a,b,cin)=S(\overline{a},\overline{b},\overline{cin}) \qquad (1)$$

$$\overline{cout}(a,b,cin)=cout(\overline{a},\overline{b},\overline{cin}) \qquad (2)$$

An important observation is that a truth table of a two's complement binary addition is inversely symmetrical (see the table in FIG. 10) with respect to one of the inputs. This means that the information in a half of the addition truth table is redundant since it may be generated, using a very simple transformation, based on the information in the other half.

In case of a 1-bit addition an arbitrary input may be choosen as a carry input signal. In a new truth table, the values of output signals (sum and carry out) are stored for all possible combinations of inputs (a and b) and for a cin="0". If cin="1", the necessary transformation to generate the output bits is as follows.

1. Negate all bits of the input operands (a and b).
2. Read the outputs from the truth table for the new (translated) inputs.
3. Negate the read-out output bits.

For a 1-bit addition, this property can be proven in the following way.

$$S=a\oplus b\oplus cin \qquad (3)$$

$$cin=0 \Rightarrow S=a\oplus b=S(a,b,cin=0)$$

$$cin=1 \Rightarrow S=\overline{a\oplus b}=S(a,b,cin=1) \qquad (4)$$

$$S(\overline{a},\overline{b},cin=0)=a\oplus b \qquad (5)$$

$$\overline{S}(\overline{a},\overline{b},cin=0)=\overline{a\oplus b} \qquad (6)$$

$$S(a,b,cin=1)=\overline{S}(\overline{a},\overline{b},cin=0) \qquad (7)$$

Similarly this inverting property applies to n-bit addition.

The described property of the binary addition operation can be directly utilized in the LUT-based computational logic elements. In a configurable device according to the invention it is sufficient that the LUT stores half of the truth table of an n-bit addition. The LUT may be a single-output LUT (in the case where one bit per LUT is generated) or a multi-output LUT (in the case where several output bits are generated) The LUT contents reflect the values of the output bits coded for a chosen polarization of the carry input signal (e.g. carry input="0"). For this chosen polarization, called here the reference polarization of the carry input signal, the LUT behaves as a traditional LUT: a combination of input bits (addition operands) determines the LUT address from which the output is read.

If the carry input signal has an inverse polarization from the reference polarization, both the LUT address and the LUT output value(s) have to be transformed. To implement this transformation, a single two-input XOR gate is connected to every input and every output of the LUT. One of the XOR signals is the carry input signal. If this signal is equal to "1", the XOR gate inverts the original polarization of the LUT address signals and the LUT outputs.

Figure 11:
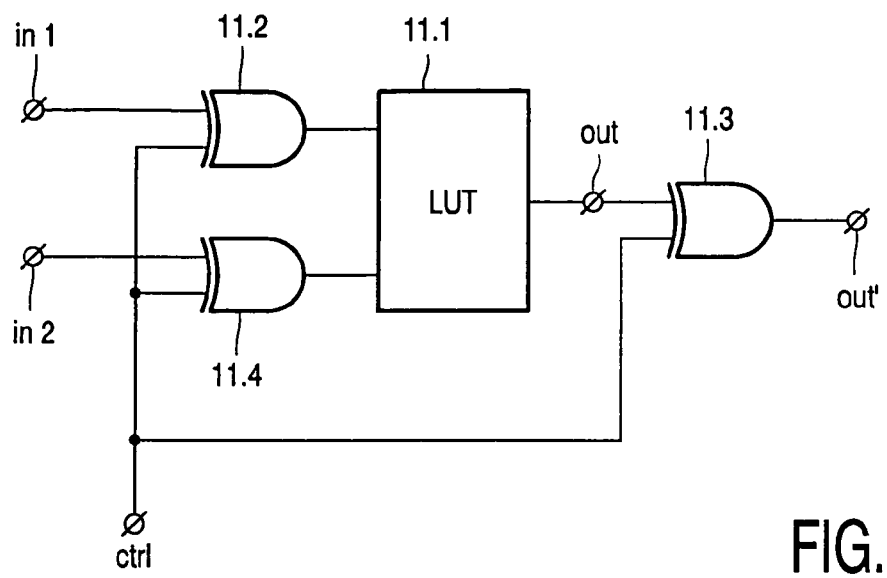

FIG. 11 shows a first embodiment of a logic element of a reconfigurable device according to the invention. The reconfigurable logic device shown comprises a logic element with a lookup table 11.1 (LUT), an input in1 for receiving an addres signal, and an output out1 for providing a binary output signal. The logic element further comprises a control input ctrl for receiving a control signal. The input in1 is coupled via an EXOR-gate 11.2 for providing an address signal to the LUT 11.1 in response to the control signal at the control input ctrl and the input signal at the input in1. The logic element has a further EXOR-gate 11.3 for providing a modified output signal out' in response to the output signal of the LUT 11.1 and the control signal at the control input ctrl. The logic element has a further address input in2 which is coupled to a further input of the LUT 11.1 via a further EXOR-gate 11.4.

Preferably the carry output signal for an n-bit addition is generated in an independent circuit, for example as described in Zimmermann R, Computer Arithmetic: Principles, Architectures, and VLSI Design, *Lecture notes*, Integrated Systems Laboratory, Swiss Federal Institute of Technology, Zurich, March, 1999. This guarantees that the carry signal, which is on a critical path, is generated in a very fast way (the delay of the dedicated circuit is smaller than the delay of a LUT). Furthermore, the use of a dedicated circuit for the carry signal leads also to a reduction of the configuration memory size since memory bits reflecting the carry output values don't have to be stored in a LUT.

The invention may be applied in a number of ways. First, since the addition is the most fundamental arithmetic operation, the presented technique may be used in LUT-based FPGAs to improve their performance and decrease the size of the configuration memory. Likewise the number of inputs of the LUT may be reduced, and therewith also a reduction of the power consumption is achieved. It may also be used to implement other arithmetic operations, such as subtraction (almost direct implementation) and multiplication. Below, a short description of possible embodiments is given.

Figure 12:
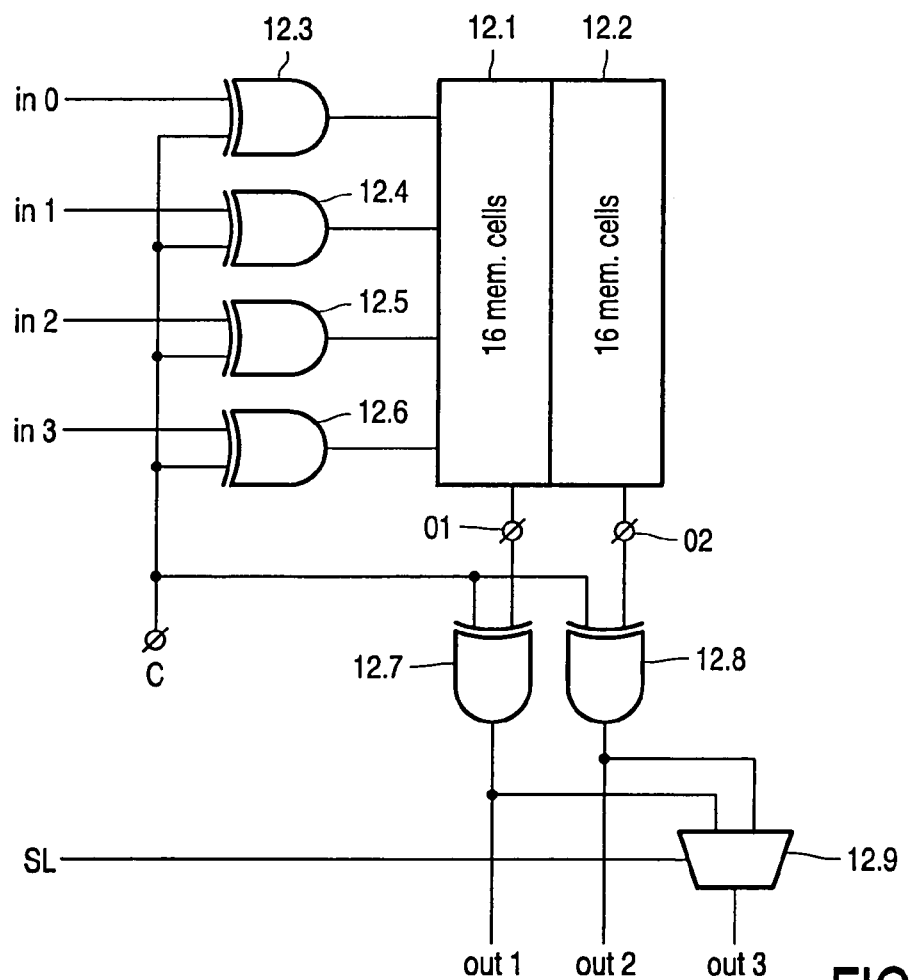

The present invention is in particular beneficial for application in coarse-grained architectures. For illustration an embodiment is shown in FIG. 12 of a logic element having four basic inputs in0, in2, in3, in4 which are coupled via EXOR-gates 12.3, 12.4, 12.5, 12.6 to the LUTS 12.1, 12.2. The outputs of the LUTS 12.1, 12.2 are coupled via further EXOR-gates 12.7, 12.8 to the outputs out1, out2 of the logic element. It also has two extra inputs C and SL. The input C provides a second input signal to the EXOR-gates 12.3, 12.4, 12.5, 12.6, 12.7, 12.8. The other extra input SL provides a selection signal to a multiplexer 12.9, which selects the output signal at one of the outputs out1, out2 as its outputsignal. Although FIG. 12 shows a logic element having a LUT with 4 inputs and 2 outputs, the invention is equally applicable in case of an arbitrary other number of bits. The logic element of FIG. 12 is suitable for implementation of any logic operation having 5 input signals, wherein:

$$out1 = \overline{C}F1(in0,in1,in2,in3) \oplus C\overline{F1}(\overline{in0},\overline{in1},\overline{in2},\overline{in3})$$

$$out2 = \overline{C}F2(in0,in1,in2,in3) \oplus C\overline{F2}(\overline{in0},\overline{in1},\overline{in2},\overline{in3})$$

A further logic function out3 is possible by also using the selection signal SL as a further input signal, wherein:

$$out3 = \overline{SL} \circ out1 + SL \circ \overline{out2}$$

Likewise it is possible in this way to generate each output function (out3) of k+1 variables as a function of a first (out1) and a second function (out2) of k variables and a selection signal (SL) as a k+1$^{th}$ variable.

$$out3(in0, \ldots, C, SL) = \overline{SL} \circ out1(in0, \ldots, C) + SL \circ \overline{out2}(in0, \ldots, C),$$

A class of functions out1, out2 can be written on their turn as a function of a first and a second primitive function of k−1 variables (F1, F2) and the variable C as the k$^{th}$ variable.

$$out1 = \overline{C}F1(in0, \ldots, in k-2) \oplus C\overline{F1}(\overline{in0}, \ldots, \overline{in k-2}),$$
and $$out2 = \overline{C}F2(in0, \ldots, in k-2) \oplus C\overline{F2}(\overline{in0}, \ldots, \overline{in k-2})$$

Figure 13:
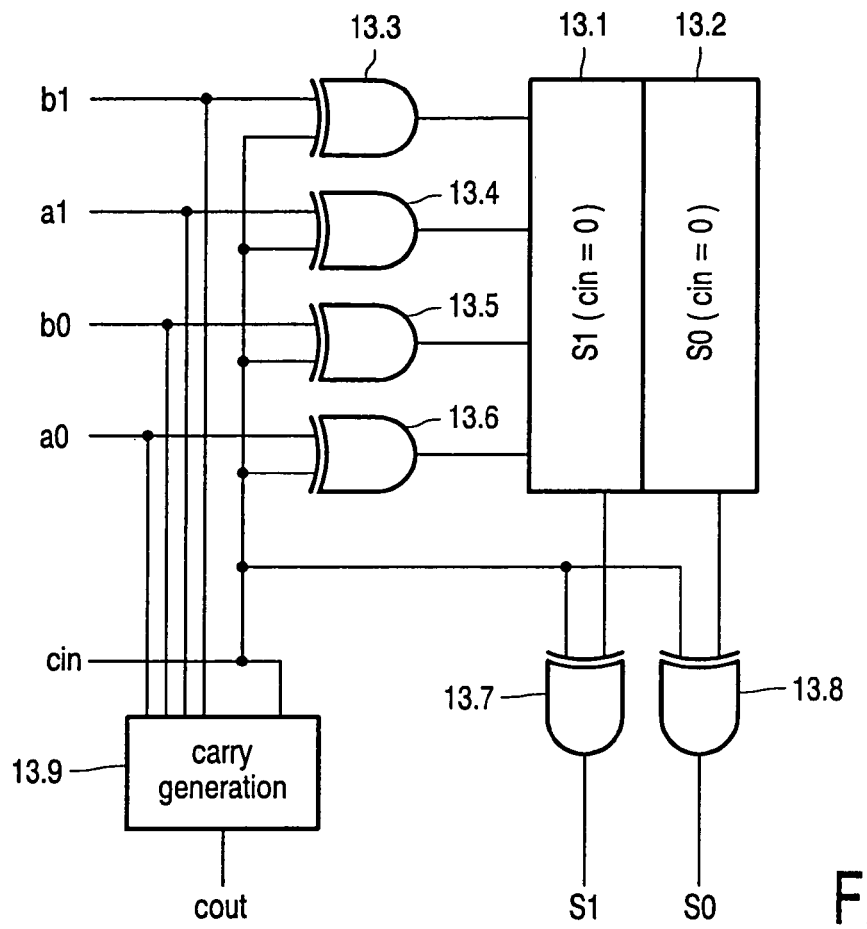

FIG. 13 shows an implementation of an adder with such a logic element. Parts therein corresponding to those of FIG. 12 are indicated therein with reference numerals having the same second portion (12.3 and 13.3 for example). An addition operation on arguments larger than 1 bit produces a multi-bit output. This may be realised with a group of 1 output bit LUTS having connected inputs. Preferably this is realised however with a multi-output LUT as described with reference to FIGS. 7 and 8. This has a number of important advantages mentioned before. In the reconfigurable device according to the invention the multi-output LUT, however, can be considerably smaller than that presented in FIG. 6: As the reconfigurable logic device according to the invention uses the inverting property of addition, the number of memory locations in the LUT 13.1, 13.2 can be reduced by two. The number of memory locations is even further reduced as in this embodiment the carry out cout is computed by a dedicated circuit 13.9.

An additional 2:1 multiplexer may be used to allow the possibility of implementing wider random logic functions. The circuits according to the invention, as shown for example in FIGS. 12, 13 have the following advantages as compared to known approaches described before.

Figure 8:
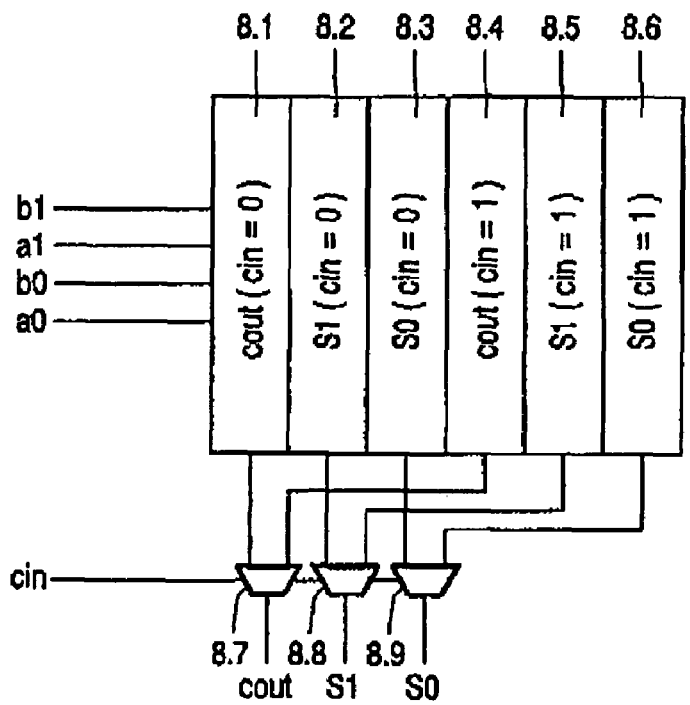

The configurable logic circuit of the invention requires only relatively small number of configuration bits as compared to the approach described with reference to FIGS. 7 and 8. In addition the circuit according to the embodiment of the invention shown in FIGS. 12 and 13 has a balanced delay of all outputs. This may prevent unnecessary signal transitions and thus decrease power consumption. Potentially a multi-output LUT as shown here, may be utilized also for random logic, as many random logic functions also generate multi-bit outputs from the same set of inputs. Although the XOR gates introduce a delay in the processing of the signals this has proven to be negligible. The circuit of the invention also requires less routing resources, and therewith a smaller area can be complied with. This also enables a reduced power consumption. The saved area can be used for memory instead, for example.

Figure 14:
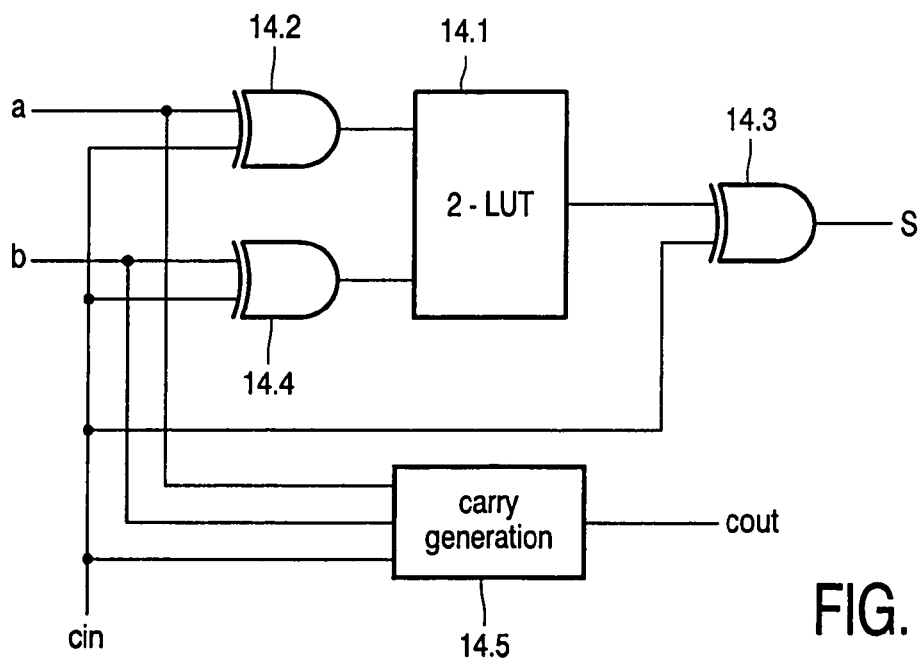

In fine-grained architectures (sea-of-cells), which are usually optimized for random logic, one or a few small LUTs (e.g. 2-LUT) are used in a logic element. To implement an arithmetic operation (e.g. addition) a number of logic cells or a number of LUTs within a logic cell have to be connected together. If on every input and output of a LUT (e.g. 2-LUT) an XOR gate is included, the functionality of a single LUT can be extended to implement an arithmetic operation. In a traditional approach such a LUT would require at least 3 inputs and thus would have $2^3$ memory cells; The measures of the invention enable the size of the LUT to be decreased by a factor of two with a very low cost of placing extra XOR gates on inputs and outputs. FIG. 14 shows this for example for a 1-bits addition with carry. Parts therein corresponding to those of FIG. 11 are indicated with reference numerals having the same second portion (11.1 and 14.1 for example). It is remarked that in configurable logic architectures usually there are two outputs per signal: one direct output and one registered output. One of these two pins may be applied as an additional output required for the carry output signal.

Figure 15A:
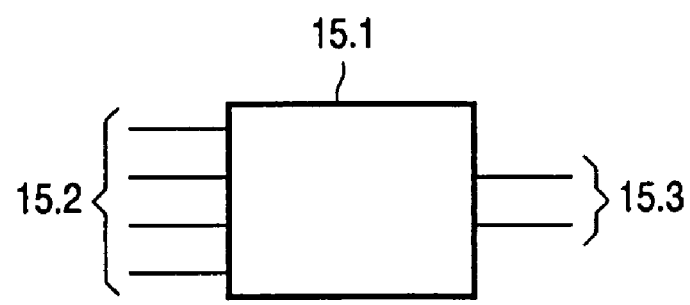
Figure 15B:
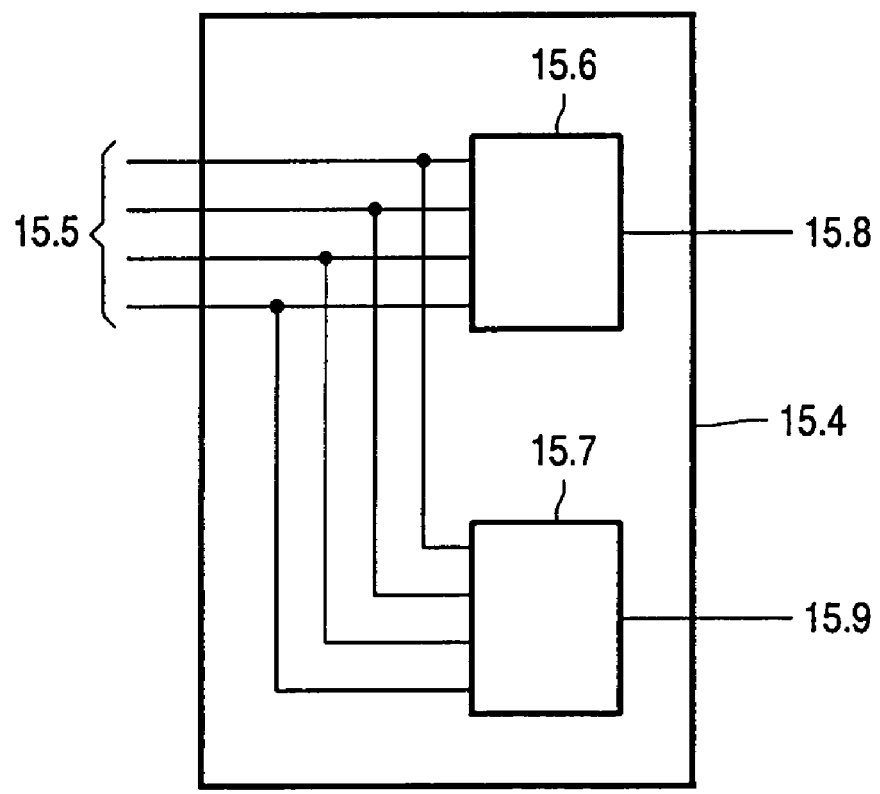
Figure 15C:
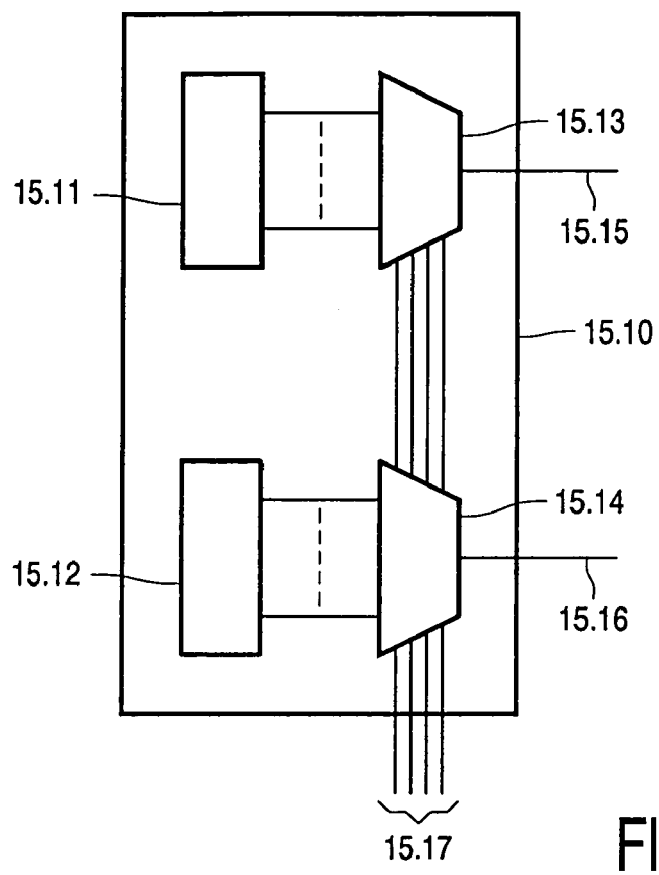

A multi-output LUT schematically shown in FIG. 15A in a reconfigurable device according to the invention may be implemented in several ways, examples thereof have been shown in FIGS. 15B and 15C.

The multi output LUT 15.1 shown in FIG. 15A has a plurality of inputs 15.2 and a plurality of outputs 15.3.

In the embodiment shown in FIG. 15B the multiple output LUT 15.4 is composed of a first 15.6 and a second 15.7 LUT having a single output 15.8 and 15.9 respectively. The inputs of the LUTS 15.6 and 15.7 are both coupled to the inputs 15.5.

A second embodiment of the multi-output LUT 15.10 is shown in FIG. 15C. It comprises a first and a second colum of memory cells 15.11 and 15.12 respectively. By means of a decoder (multiplexer) 15.13 one of the outputs of the first colum 15.11 is selected to provide an output signal at output 15.15, and one of the outputs of the second colum 15.12 is selected to provide an output signal at output 15.16. The decoders are controlled by the input signals 15.17.

Figure 15D:
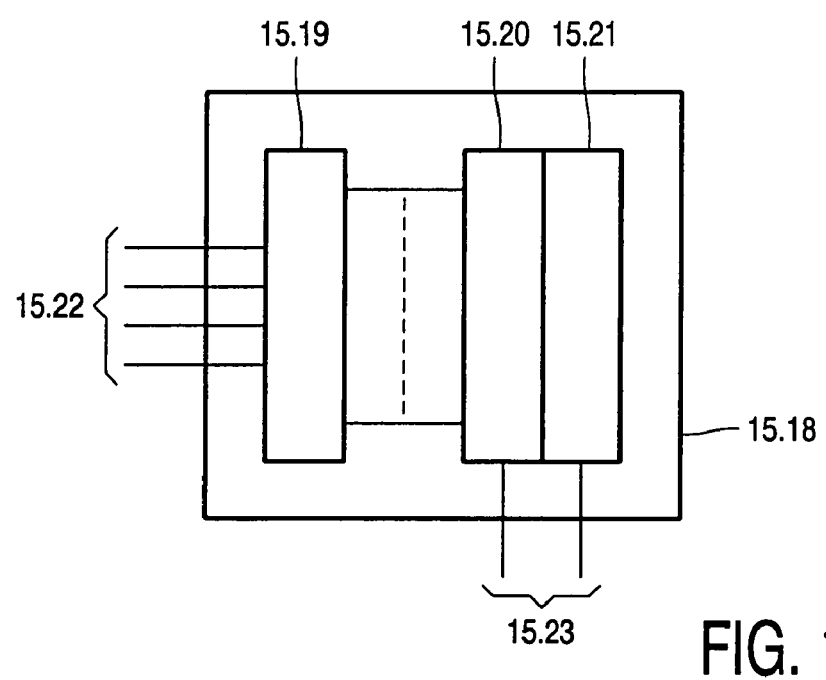

A third embodiment of a multi output LUT 15.18 is shown in FIG. 15D. It comprises a decoder 15.19 for decoding the input signals into an address for a first and a second memory colum 15.20 and 15.21 respectively. The memory colums 15.20 and 15.21 each provide one of the output signals 15.23.

Table 7-1 shows a comparison between the described state-of-the-art logic elements and the logic element based on the proposed approach. The first colum (TYPE) refers to the type of logic element. Since the logic elements differ in terms of their granularities, the number of logic elements (NL) required to implement a 2-bit adder using an arbitrary type of a logic element is taken as a reference. Based on this number the total cost described by parameters as presented in the table is calculated.

The third column shows the type of logic functions (TLF) which can be implemented. The expression k×(mI+nO) therein means that a maximum of k logic functions can be implemented with a maximum of m inputs and n outputs. Of course it is not necessary to use each input and output. The fourth column shows the number of configuration bits (NC) which is required for a 2-bit adder implementation. The complexity of the LUT decoders (CLUT) is included in the fifth column. The routing complexity (RC) for implementing arithmetic functions is shown in colum s ix. The routing complexity is expressed as the minimum number of tracks which is required for the input and output signals.

A measure for the total cost TC is:

$$TC = NL(NC + CLUT) + RC$$

TABLE 1

A comparison of the reconfigurable logic circuit according to the invention (INV) with known reconfigurable logic circuits.

| TYPE | NL | TLF | NC | CLUT | RC | PERF |
|---|---|---|---|---|---|---|
| Xilinx/Virtex-I | 1 | 2 × (4I + 1O) or<br>1 × (5I + 1O) | $2 \times 2^4 = 32$ | 2 × (16:1) | I: [(2 × 4) + 1] + O: 3<br>T = 12 | medium |
| Atmel AT40K | 2 | 2 × (4I + 1O) or<br>1 × (5I + 1O) | $4 \times 2^3 = 32$ | 4 × (8:1) | I: 2 × 3 + O: 3<br>T = 9 | low |
| LP-FPGA | 1 | 1 × (4I + 1O) + 2 × (2I + 2O)<br>or<br>1 × (5I + 1O) | $4 \times 2^3 = 32$ | 4 × (8:1) | I: 5 + O: 3<br>T = 8 | medium |
| RCCA | 1 | 1 × (4I + 6O) or<br>1 × (5I + 3O) | 1 × 24 × 6 = 96 | 1 × (4:16) | I: 4 + 1<br>O: 3<br>T = 8 | high |
| INV | 1 | 1 × (4I + 2O) or<br>1 × (5I + 1O) | $2 \times 2^4 = 32$ | 1 × (4:16) | I: 4 + 1<br>O: 3<br>T = 8 | high |

Figure 16:
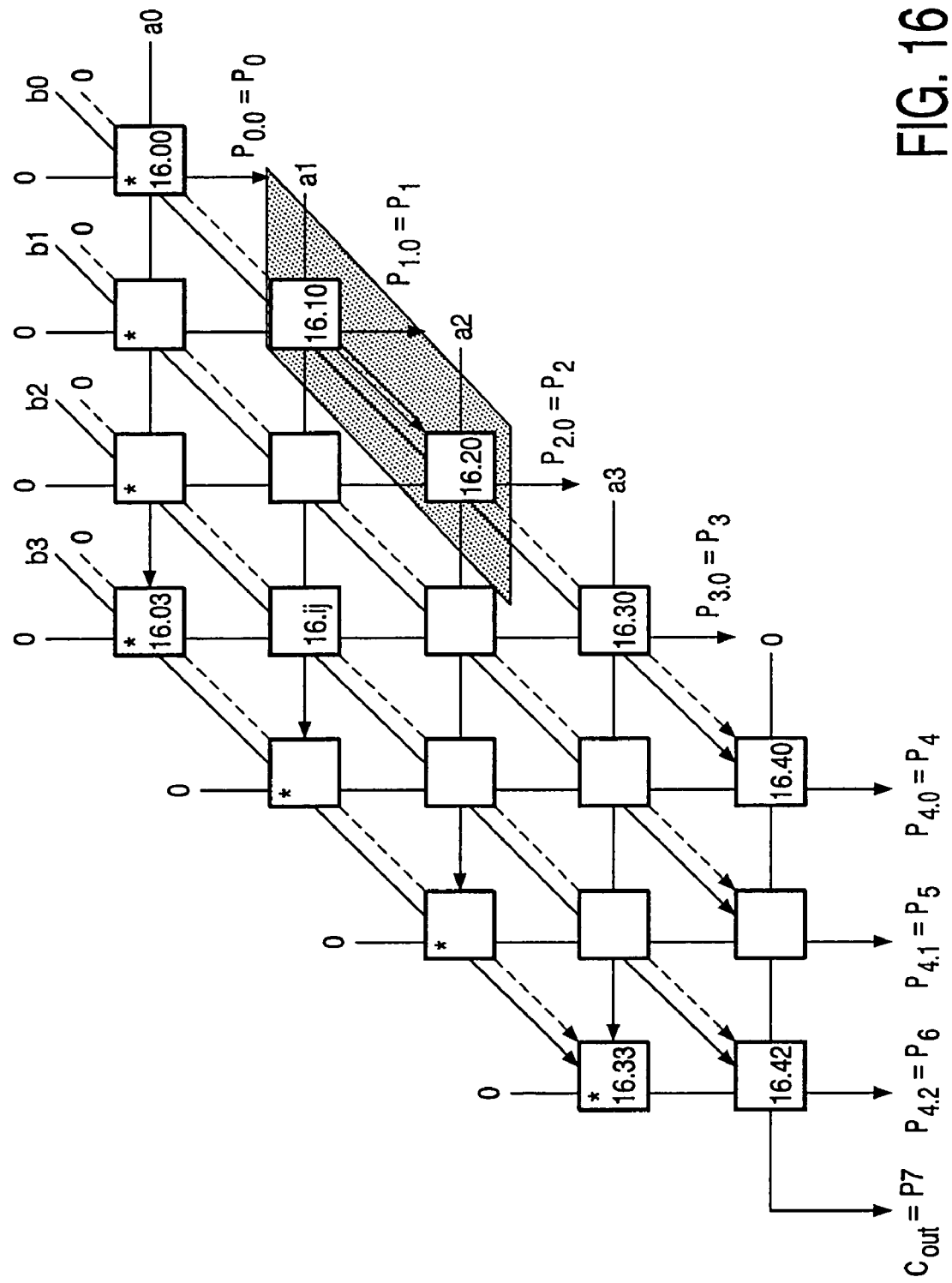

From this comparison it is clear that reconfigurable device according to the invention achieves a relatively high performance with a modest number of configuration bits. On the one hand the performance is comparable to that of the fast RCCA type of reconfigurable circuits. On the other hand the number of configuration bits required is comparable to that of the reconfigurable circuits of the type LP-FPGA for example. The reconfigurable logic device according to the invention is particularly suitable for application in a multiplier array. By way of example FIG. 16 shows a multiplier array for multiplying two numbers $a0, \ldots, a_{n-1}$ and $b0, \ldots, b_{m-1}$. The array is in the form of a carry save multiplier, having a 'vertical' carry propagation. Such an array is preferred, as it faster than a ripple carry multiplier, having a relatively slow 'horizontal' carry propagation. Although several implementations are possible, preferably a so called Braun array is used for multiplying unsigned numbers, and a modified Pezaris array multiplier for two's complement numbers. In this case n=m=4, but it will be clear to the person skilled in the art that such an array could be constructed for any combination of n and m. The multiplier array provides an output number $P_0, \ldots P_{n+m-1}$.

Figure 17:
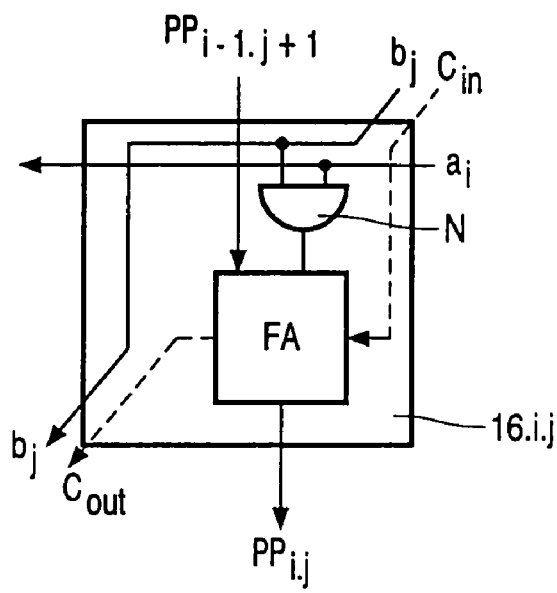

As shown in FIG. 16 the array is composed of multiply elements 16.i.j. One of those elements is shown in more detail in FIG. 17. The multiply elements comprise an AND-gate N and a full adder FA. The AND-gate N calculates the product of ai and bj, and the full adder FA adds the result to the partial product PPi-1.j+1 obtained from the multiply element 16.i−1.j+1. In response thereto the full adder provides a further partial product PPi.j and a carry out signal cout. For the multiply elements 16.0.j in the first row of the array the input partial product P−1.j+1='0'. The output bits P0, ..., P3 are equal to the partial products PPi.j outputted by the multiply elements 16.i.0. The output bits P4 to P6 are provided by the partial products outputted by the multiply elements 16.4.0-16.4.2 resp. The last output bit P7 is equal to the carry out bit of the multiply element 16.4.2. In case of a n×m multiplier the output bits P0, ... Pn−1 are provided by the partial products of the multiply elements 16.0.0 until 16.n−1.0 respectively. The bits Pn, ..., Pn+m−2 are provided by the multiply elements 16.n.0 until 16.n.m−1 respectively, and bit Pn+m−1 is provided by the cout output of multiply element 16.n.m−1.

In a practical implementation the multiplyer array can be simplified as follows. The multiplier elements 16.0.0, ..., 16.0.3 and 16.1.3, ..., 16.3.3 indicated by a '*' can be simplified to an AND-gate, as the partial products PP and the carry in signal cin received by these elements are all '0'. Hence the elements 16.0.j merely have to calculate the product a0 AND bj, and the elements 16.i.3 merely have to calculate ai AND b3.

Figure 18:
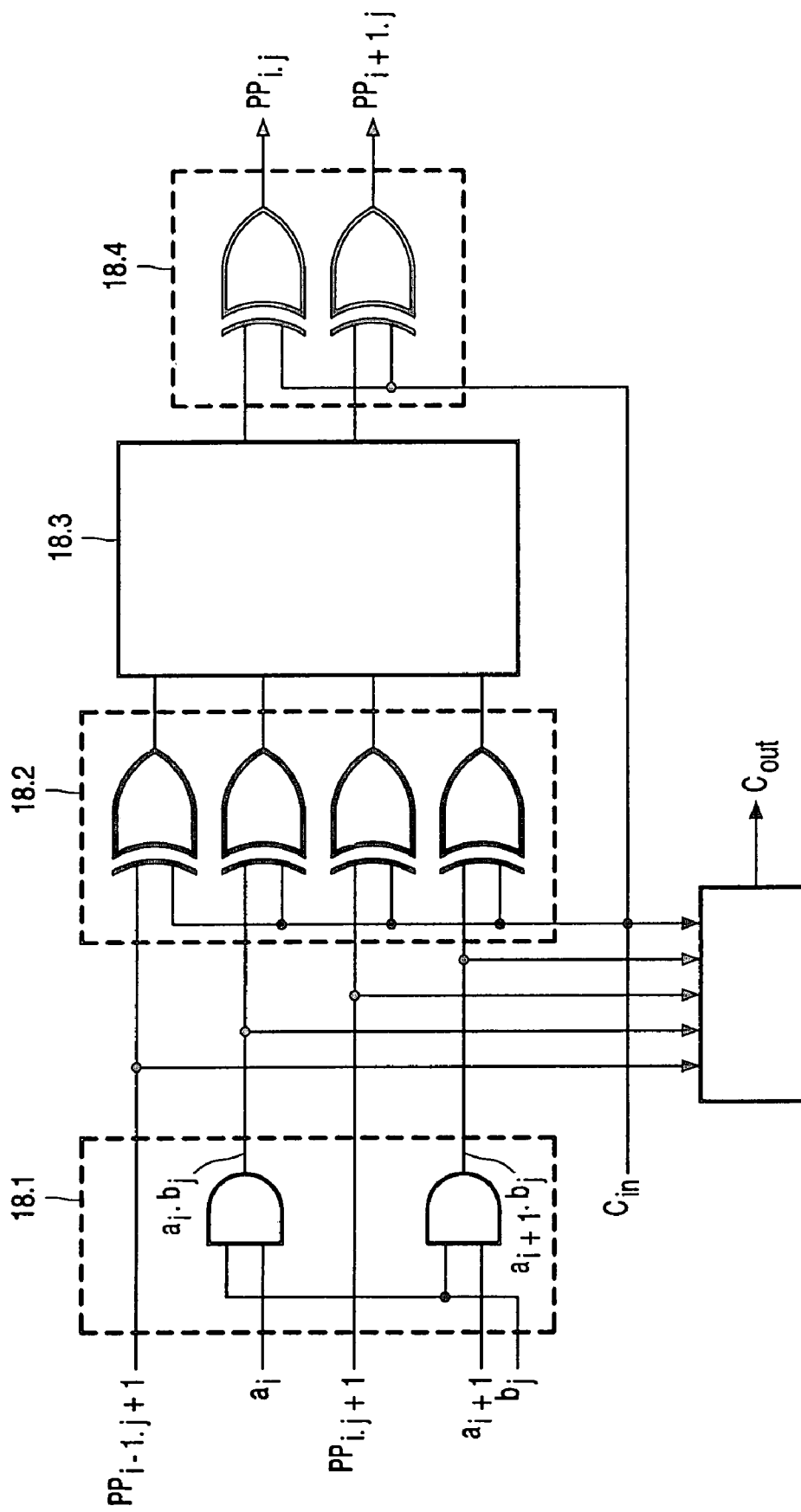

Furthermore, two elements 16.i.j and 16.i+1.j can be implemented by a reconfigurable logic device according to the invention as shown schematically in FIG. 18. The reconfigurable logic device shown therein comprises an AND-unit 18.1, a first controllable inverting gate 18.2, a lookup table 18.3, a second controllable inverting gate 18.4 and a separate circuit 18.5 for carry calculation. The reconfigurable logic device shown in FIG. 18 calculates the three bit number $c_{out}|PPi+1.j|PPi.j$ as the sum of the two bit number PPi.j+1|PPi−1.j+1, the two bit number ai+1.bj|ai.bj and the one bit number $c_{in}$.

Figure 19:
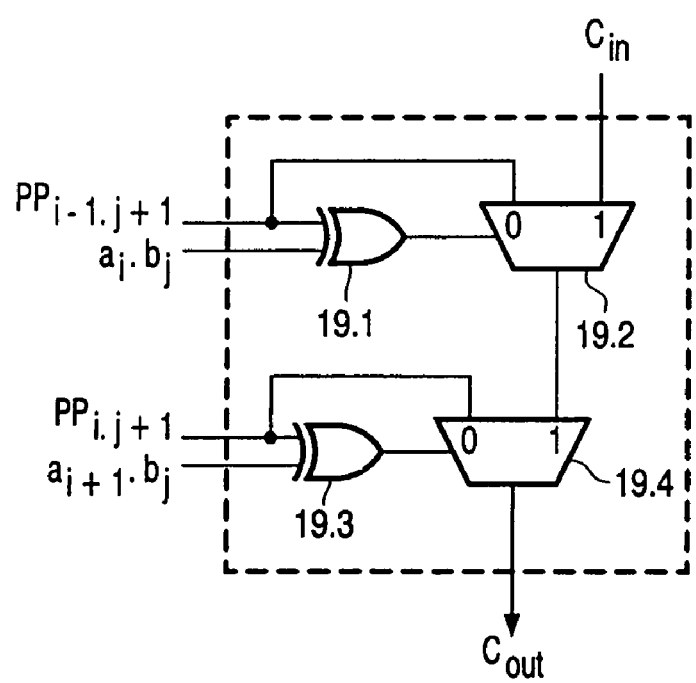

The AND-unit 18.1 comprises AND-gates for calculating the products ai.bj and ai+1.bj. The adder formed by the units 18.2, 18.3 and 18.4 subsequently calculates the bits PPi.j and PPi+1.j. The circuit 18.5 which calculates the bit $c_{out}$ is shown in more detail in FIG. 19. The circuit comprises a first and a second XOR gate 19.1 and 19.3 and multiplexers 19.2 and 19.4 respectively.

Figure 20:
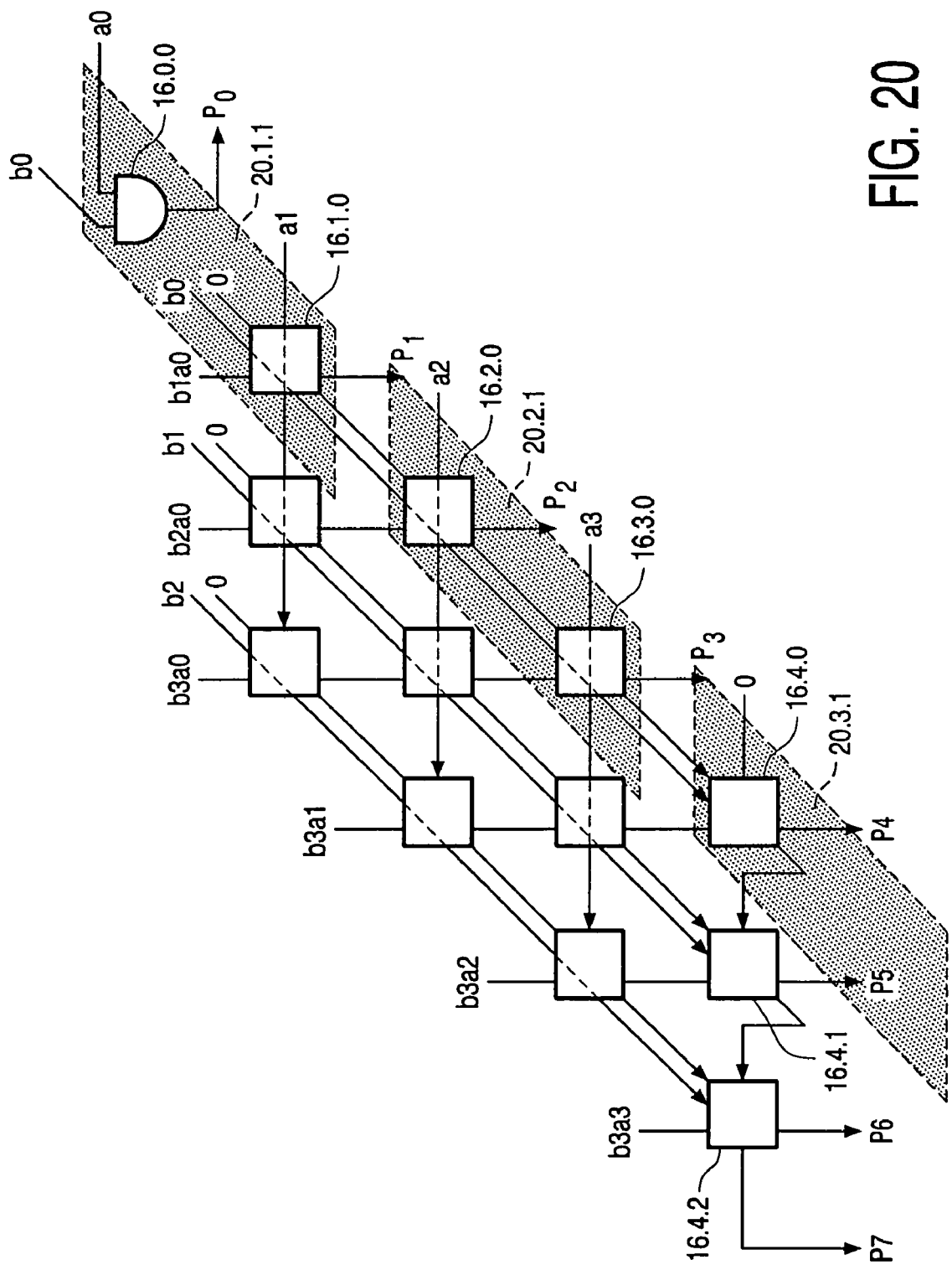
FIGS. 20 and 21 show two possibilities of implementing a multiplier array having an even number of rows in regular array of reconfigurable elements according to the invention.
Figure 21:
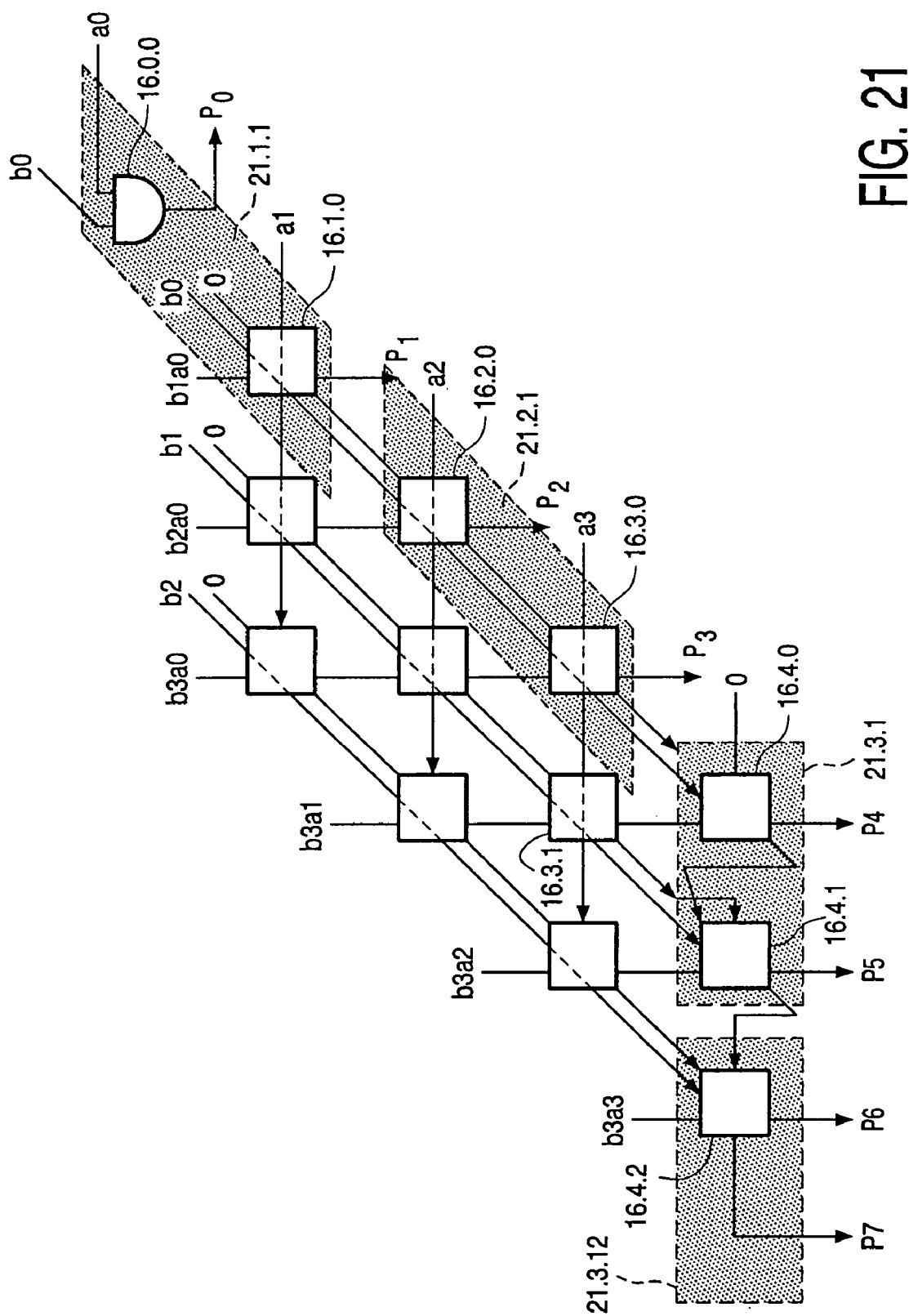

A multiplier array can be implemented in several ways in a regular array of reconfigurable elements according to the invention. FIGS. 20 and 21 show a first and a second implementation of a multiplier array having an even number of rows.

Therein each reconfigurable element 20.i.j is represented as a rectangle having a first and a second portion. If only one of the portions is cross hatched, only one of the lookup tables in the reconfigurable element is used. If both portions are cross hatched, the entire lookup table is used. For example the central elements 20.2.1, each implement two multiplier elements as shown in FIG. 18. In the last row of reconfigurable elements 20.3.1, only one part of the lookup-table is used, for each of the multiplier elements 16.4.0, 16.4.1 and 16.4.2 respectively. In this last row the first multiplier array element 16.4.0 has its ai input set to "0". Its cout output is coupled to the ai input of the next multiplier array element 16.4.1. Analogously each further multiplier array element 16.4.j of the last row has its ai input coupled to the preceeding array element in that row 16.4.j−1. The cout output of the last multiplier element 16.4.2 provides the last output bit P7 of the multiplication result.

Preferably the AND-unit 18.1 of the reconfigurable element comprises at least 4 AND-gates. This makes it possible to implement a multiplier element 16.0.j of the first row and a multiplier element 16.1.j−1 of the second row in one portion of a reconfigurable element 20.1.j.

Figure 22:
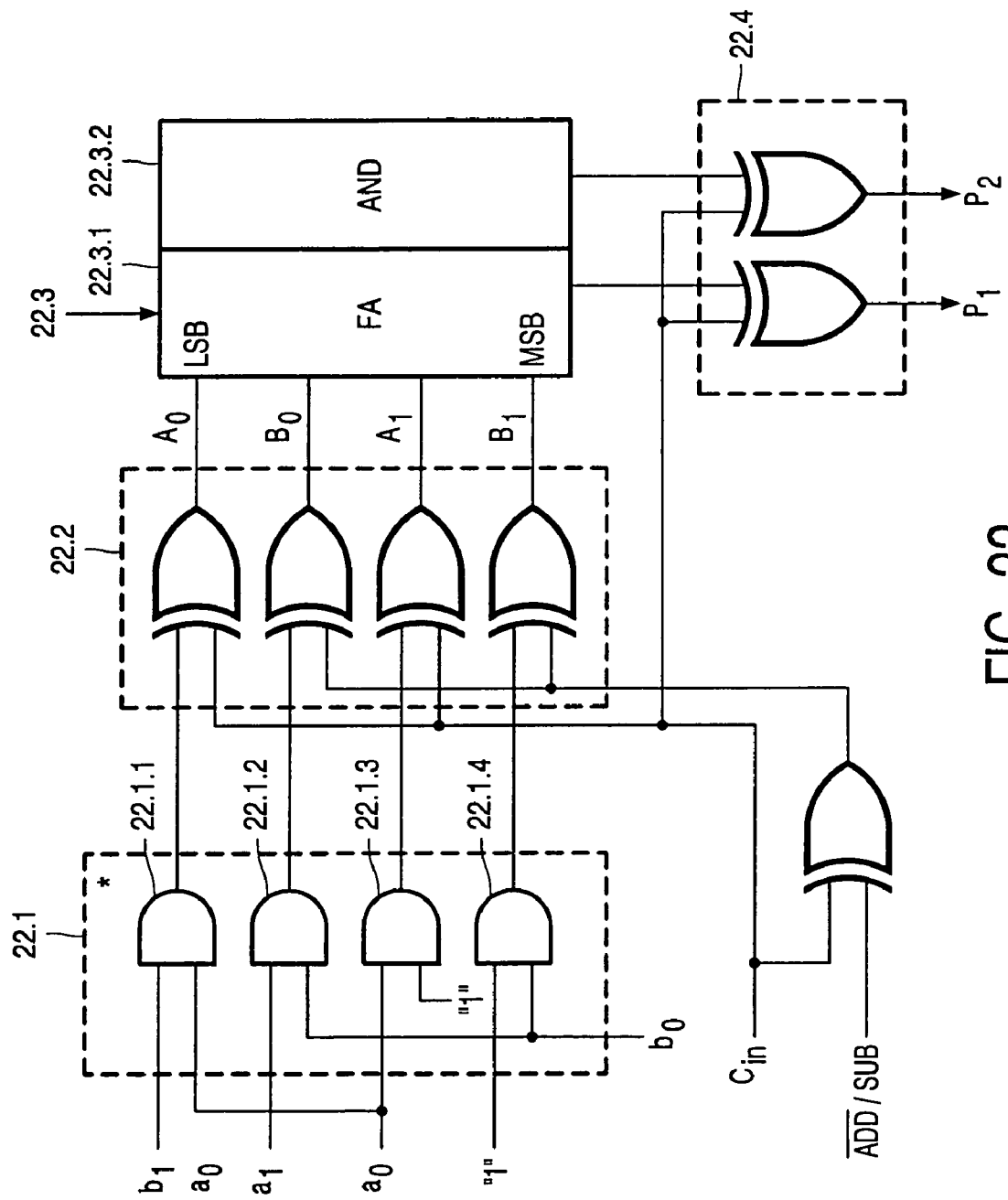
FIG. 22 shows the configuration of one of the elements in more detail.

This is illustrated in FIG. 22. In FIG. 22 elements 22.n correspond to elements 18.n in FIG. 18. FIG. 22 shows the implementation of the multiplier elements 16.0.0, 16.0.1 and 16.1.0 in one reconfigurable element 20.1.1. As compared to FIG. 18, one additional AND-gate 22.1.1 is used to calculate the partial product a0.b1. Another additional adder 22.1.3 has one of its inputs connected to logic "1", so that the input signal a0 is transmitted unmodified to the controllable inverting gate 22.2. The first column 22.3.1 of the lookup table 22.3 is used to calculate the product P1. The second column 22.3.2 is used to implement the AND operation a0.b0 having result P0. The content of the lookuptable is represented in the following table.

| B1 | A1 | B0 | A0 | column 1 | column 2 |
|----|----|----|----|----------|----------|
| 0 | 0 | 0 | 0 | 0 | 0 |
| 0 | 0 | 0 | 1 | 1 | 0 |
| 0 | 0 | 1 | 0 | 1 | 0 |
| 0 | 0 | 1 | 1 | 0 | 0 |
| 0 | 1 | 0 | 0 | 0 | 0 |
| 0 | 1 | 0 | 1 | 1 | 0 |
| 0 | 1 | 1 | 0 | 1 | 0 |
| 0 | 1 | 1 | 1 | 0 | 0 |
| 1 | 0 | 0 | 0 | 0 | 0 |
| 1 | 0 | 0 | 1 | 1 | 0 |
| 1 | 0 | 1 | 0 | 1 | 0 |
| 1 | 0 | 1 | 1 | 0 | 0 |
| 1 | 1 | 0 | 0 | 0 | 1 |
| 1 | 1 | 0 | 1 | 1 | 1 |
| 1 | 1 | 1 | 0 | 1 | 1 |
| 1 | 1 | 1 | 1 | 0 | 1 |

FIG. 21 shows another implementation of the multiplier array. The embodiment of FIG. 21 differs from that of FIG. 20, in that a multiplier element 16.4.0 and an element 16.4.1 in the last row are combined in one reconfigurable element 21.3.1. Contrary to the embodiment of FIG. 20 the output cout of multiplier element 16.4.0 is connected to input cin of element 16.4.1. The ain input of multiplier element 16.4.1 is connected to the output cout of element 16.3.1. The multiplier element 16.4.2 is connected in te same way as the corresponding element in FIG. 20.

Figure 23:
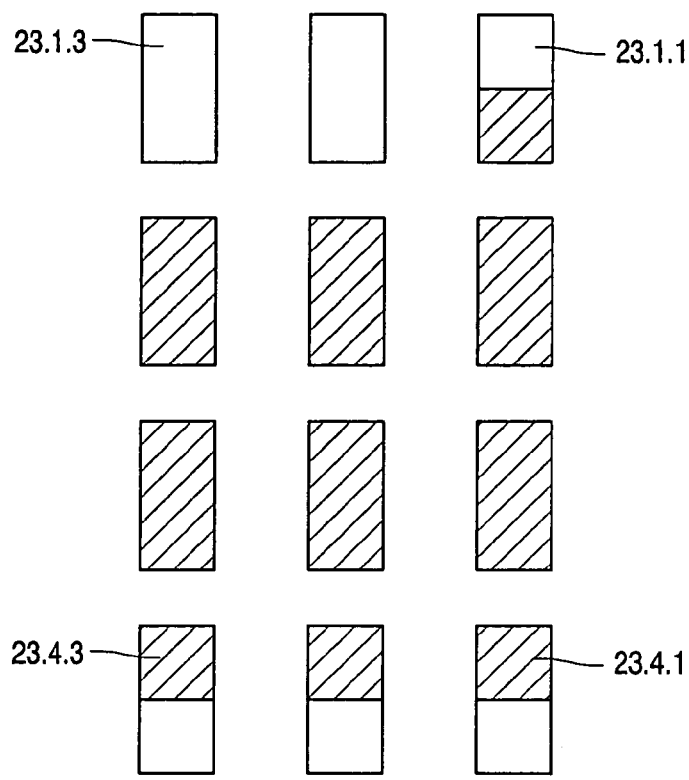
FIGS. 23 and 24 show two possibilities of implementing a multiplier array having an odd number of rows in regular array of reconfigurable elements according to the invention.
Figure 24:
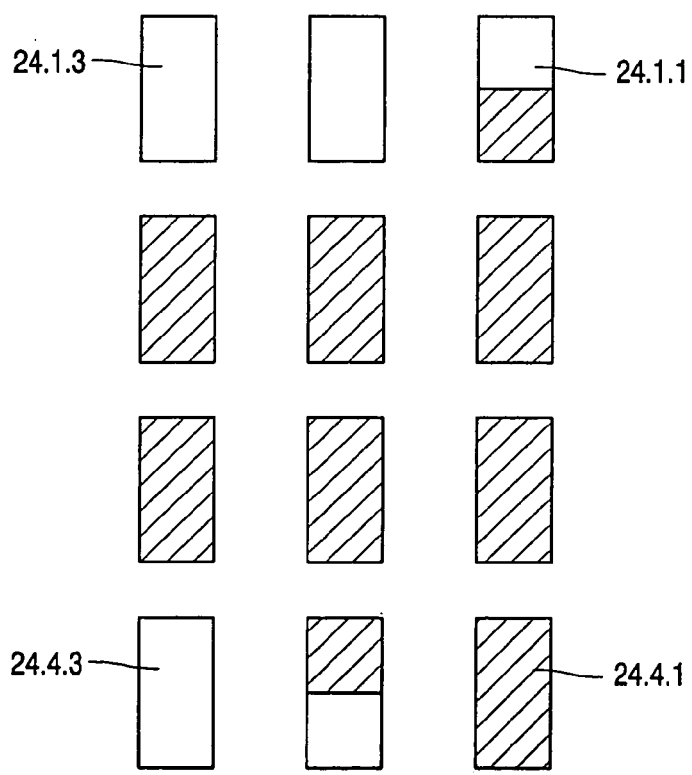

In an analogous way a multiplier array having an odd number of rows can be implemented as is schematically illustrated in FIGS. 23 and 24. FIG. 23 shows an embodiment wherein each reconfigurable element 23.4.j in the last row comprises one multiplier element. FIG. 24 shows an embodiment wherein two multiplier elements are combine in an element 24.4.1 analogous as is shown for element 21.3.1 in FIG. 21.

Figure 25:
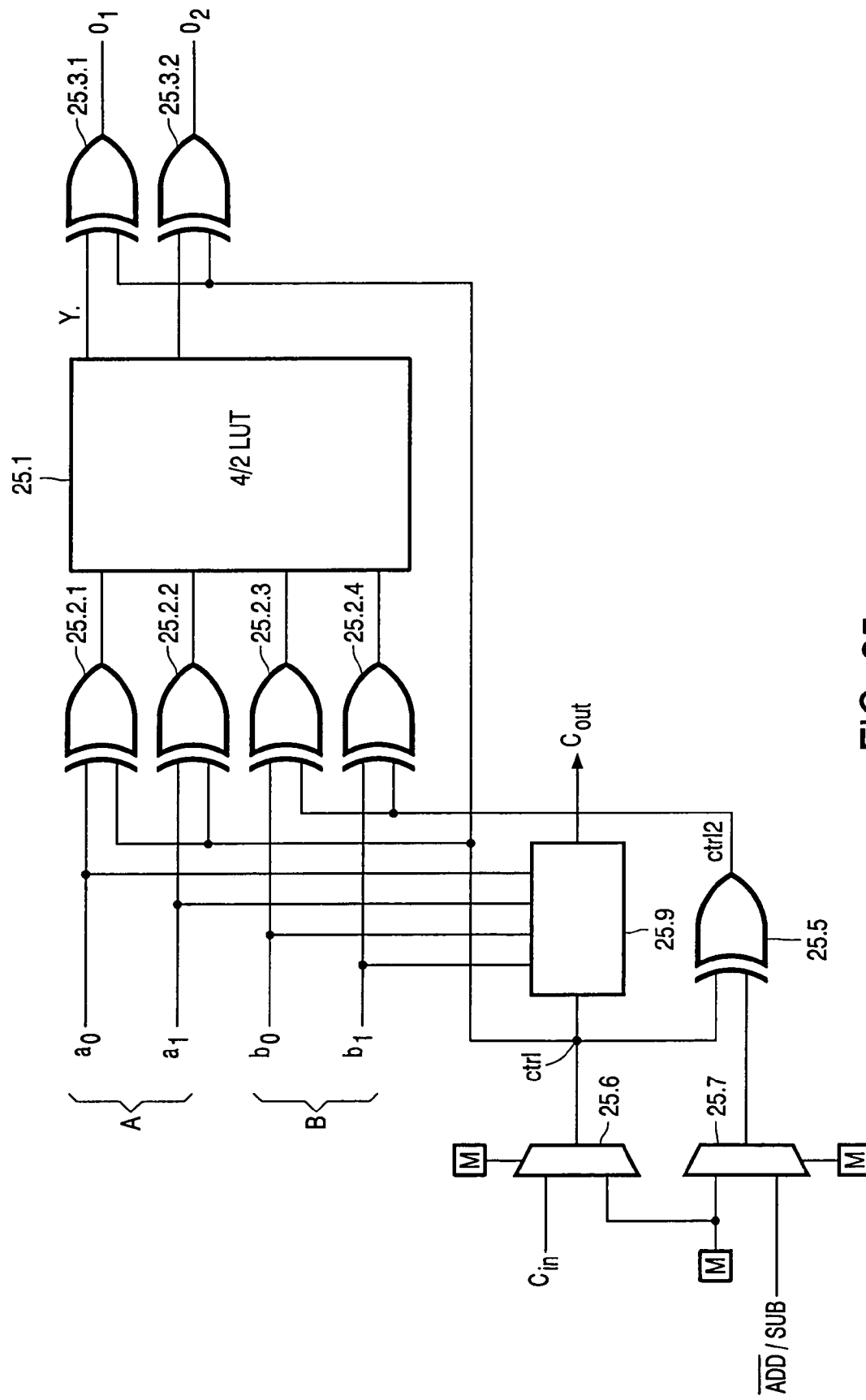
FIG. 25 shows a further embodiment of a reconfigurable element according to the invention.

The embodiment of the reconfigurable logic element of the invention shown in FIG. 25 makes it easily possible to change the functions Add and Substract.

Analogous to the logic element shown in FIG. 11, it has a lookup table 25.1, inputs a0, a1, for receiving input signals and outputs o0, o1 for providing output signals. It also has a control input ctrl for receiving a control signal, and controllable inverting gates 25.2.1, 25.1.2 for providing address signals to the LUT 25.1 in response to the control signal ctrl and the input signals at inputs a0,a1. It further has controllable inverting gates 25.3.1, 25.3.2 for providing a modified output signal o0,o1 in response to the output signals of the LUT 25.1 and the control signal ctrl.

In addition to the embodiment shown in FIG. 11, it has a mode control input $\overline{ADD}$/SUB for selecting a ADD or SUBTRACT mode. The embodiment shown in FIG. 25 also has a combination element 25.5, here an EXOR-gate, for generating a modified control signal ctrl2. The embodiment of FIG. 25 further has controllable inverting gates 25.2.3, 25.1.4 for providing address signals to the LUT 25.1 in response to the modified control signal ctrl and the input signals at inputs b0, b1. As shown in FIG. 25 the control signal ctrl is generated by a first multiplexer 25.6 having a first input coupled to a carry in signal input cin, and a second input coupled to a configuration memory element M. The multiplexer 25.6 further has a control input connected to a configuration memory element. The combination element 25.5 receives as a first input the control signal ctrl and has a second input coupled to a second multiplexer 25.7. The second multiplexer 25.7 is controlled by a first configuration element to select between the $\overline{\text{ADD}}$/SUB mode control signa and a fixed value from the configuration memory.

The invention claimed is:

1. Reconfigurable logic device comprising:
   a lookup table;
   an input for receiving an input signal and an output for providing an output signal of the lookup table;
   a control input for receiving a control bit;
   a controllable inverting gate for providing an address signal to the lookup table in response to the control bit and the input signal; and
   a controllable inverting gate for providing a modified output signal in response to the output signal of the lookup table and the control bit.

2. Reconfigurable logic device according to claim 1, comprising one or more further inputs for receiving input signals.

3. Reconfigurable logic device according to claim 2, wherein one or more additional inputs are coupled to the lookup table via a a controllable inverting gate which provides an address signal to the lookup table in response to the control bit and the address signal received at said additional inputs.

4. Reconfigurable logic device according to claim 3, comprising a further output signal provided by the lookup table, a further controllable inverting gate for providing a further modified output signal in response to the further output signal of the lookup table and the control bit, and a multiplexer which is controlled by a selection signal so as to select from at least the modified output signal and a the further modified output signal as the output signal of the logic element.

5. Reconfigurable logic device according to claim 1, wherein the lookup table has one or more additional outputs which are coupled to an EXOR-gate for providing a modified output signal in response to the output signal at said output of the lookup table and the control bit.

6. Reconfigurable logic device according to claim 1, wherein the lookup table is implemented as a multi-output lookup table.

7. Multiplication array comprising a plurality of multiplication elements formed by a reconfigurable logic device, each multiplication elements comprising:
   an AND-unit with at least one AND-gate for calculating as a first product the product of an input bit of a first number and an input bit of a second number;
   a lookup table;
   a plurality of inputs for receiving a plurality of input signals and a plurality of outputs for providing a plurality of output signals of the lookup table;
   a control input for receiving a control bit;
   a plurality of controllable inverting gates for providing an address signal to the lookup table in response to the first product, the control bit, and at least one of the plurality of input signals; and
   a plurality of controllable inverting gates for providing a plurality of modified output signals in response to the plurality of output signals of the lookup table and the control bit;
   wherein the reconfigurable logic device calculates the sum of the first product and an input partial product.

8. Multiplication array according to claim 7, wherein the reconfigurable logic device calculates an n+1 bit number as the sum of: (i) a n bit number, the bits of which are partial products obtained by predecessor multiplication elements and are provided as respective ones of the plurality of input signals; (ii) an n bit number obtained by the AND-unit multiplying n bits of the first input signal with an input bit of the second signal; and (iii) a one bit carry in signal provided as the control bit.

* * * * *